United States Patent [19]
Kishii et al.

[11] Patent Number: 5,937,071
[45] Date of Patent: Aug. 10, 1999

[54] SOUND FIELD EXPANDING APPARATUS WITH IMPROVED TONE CONTROL SYSTEM

[75] Inventors: Tatsuya Kishii; Masao Noro, both of Hamamatsu, Japan

[73] Assignee: Yamaha Corporation, Hamamatsu, Japan

[21] Appl. No.: 08/936,136

[22] Filed: Sep. 24, 1997

[30] Foreign Application Priority Data

Sep. 30, 1996 [JP] Japan ..................................... 8-259476
Aug. 6, 1997 [JP] Japan ..................................... 9-212191

[51] Int. Cl.$^6$ .............................. H03G 5/00; H04R 5/00
[52] U.S. Cl. ................................... 381/98; 381/1; 381/17
[58] Field of Search ................................. 381/1, 17–23, 381/61–63, 101, 102, 108, 98

[56] References Cited

U.S. PATENT DOCUMENTS

| | | | |
|---|---|---|---|
| 4,191,852 | 3/1980 | Nishikawa | 381/101 |
| 4,220,817 | 9/1980 | Kampmann | 381/101 |
| 4,868,878 | 9/1989 | Kunugi et al. | 381/1 |
| 4,980,914 | 12/1990 | Kunugi et al. | 381/1 |
| 5,337,368 | 8/1994 | Kikuchi et al. | 381/102 |
| 5,359,665 | 10/1994 | Werrbach | 381/102 |
| 5,481,617 | 1/1996 | Bjerre | 381/98 |
| 5,509,080 | 4/1996 | Roberts | 381/98 |
| 5,550,925 | 8/1996 | Hori et al. | 381/98 |
| 5,657,391 | 8/1997 | Jyosako | 381/1 |
| 5,661,808 | 8/1997 | Klayman | 381/1 |
| 5,727,066 | 3/1998 | Elliott et al. | 381/1 |

FOREIGN PATENT DOCUMENTS

| | | | |
|---|---|---|---|
| 0464607 | 1/1992 | European Pat. Off. | 381/17 |
| 380400 | 12/1991 | Japan . | |

*Primary Examiner*—Forester W. Isen
*Assistant Examiner*—Xu Mei
*Attorney, Agent, or Firm*—Pillsbury Madison & Sutro LLP

[57] ABSTRACT

A sound field processor having amplitude/phase conversion circuits for left and right channels of a stereophonic signal. The amplitude/phase conversion circuits for left and right channels have substantially the same circuit structure. Each of the amplitude/phase conversion circuits has an inversion amplifier, an amplitude/phase characteristic changing circuit that changes amplitude and phase characteristics of an output from the inversion amplifier, and a feedback device that add outputs from the amplitude/phase characteristic changing circuit and outputs from the inversion amplifier to an input signal to generate a sum signal and feed back the sum signal to the inversion amplifier. An output from the inversion amplifier for the left channel and an output from the amplitude/phase characteristic changing circuit for the right channel are added by a first adder device. An output from the inversion amplifier for the right channel and an output from the amplitude/phase characteristic changing circuit for the left channel are added by a second adder device. An output from the amplitude/phase characteristic changing circuit is fed back through a feedback path between an output and an input of the amplitude/phase characteristic changing circuit. A D/A converter is interposed in the feedback path to adjust the level of the feedback signal to perform bass control.

5 Claims, 5 Drawing Sheets

SOUND FIELD EXPANDING APPARATUS WITH IMPROVED TONE CONTROL SYSTEM

BACKGROUND OF THE INVENTION

1. Field of the Invention

The present invention relates to a sound field processor, and more particularly to a sound filed expanding apparatus that expands the sound field of a two-channel stereophonic sound.

2. Description of Related Art

In a conventional two-channel stereophonic apparatus, sound distribution that is generated by right and left speakers of the apparatus is limited within a range between the right loudspeaker and the left loudspeaker. A sound field expanding apparatus is used to expand the sound distribution to areas outside the speakers. In expanding the sound field of a two-channel stereophonic sound, an amplitude/phase characteristic changing circuit is used to add a specified amplitude characteristic and a phase characteristic to a signal on each of the two channels. Then, the two signals are added to each other.

However, when a sound field of original sound is merely expanded without any acoustic correction, reproduced sound is substantially, acoustically changed from the original sound. In this case, an acoustic correction is required to correctly reproduce the original sound. For example, an acoustic correction may be performed by a tone control method. However, the tone control method generally does not provide a satisfactory result. In order to correctly reproduce the original sound, influences resulting from an amplitude factor $x(f)$ and a phase factor $\theta(f)$ that are added by the amplitude/phase characteristic changing circuit for expanding the sound field need to be eliminated from the signals with an appropriate method. For example, such influences may be removed with or without an inverse characteristic adder circuit that adds an inverse characteristic to the signals.

FIG. 5 shows an example of a sound field expanding apparatus that removes influences of amplitude and phase factors added by an amplitude/phase characteristic changing circuit without using an inverse characteristic adder circuit (see Japanese patent publication HEI 3-80400).

As shown in FIG. 5, amplitude/phase converter circuits 41a and 41b are provided for two inputs of left and right channels. The amplitude/phase converter circuits 41a and 41b include, respectively, inversion amplifiers 42a and 42b and amplitude/phase characteristic changing circuits 43a and 43b that change amplitude/phase characteristics of outputs from the amplitude/phase characteristic changing circuits 43a and 43b. Outputs from the inversion amplifiers 42a and 42b and outputs from the amplitude/phase characteristic changing circuits 43a and 43b are added to input signals of the respective channels by adders 46a and 46b, respectively. Outputs from the adders 46a and 46b are fed back as inputs to the respective inversion amplifiers 42a and 42b.

An output from the amplitude/phase characteristic changing circuit 43a of the amplitude/phase converter circuit 41a is added to an output from the inversion amplifier 42b of the other amplitude/phase converter circuit 41b by an adder circuit 44b, and is outputted through a tone control circuit 45b. In a similar manner, an output from the amplitude/phase characteristic changing circuit 43b of the amplitude/phase converter circuit 41b is added to an output from the inversion amplifier 42a of the other amplitude/phase converter circuit 41a by an adder circuit 44a, and is outputted through a tone control circuit 45a.

As shown in FIG. 6, each of the tone control circuits 45a and 45b shown in FIG. 5 is formed from, for example, an operation amplifier OP, fixed resistances R1, R2 and R3, variable resistances VR1 and VR2, and capacitors C1 and C2. The capacitor C1 (which is a low-frequency cut capacitor) is connected in parallel with the variable resistance VR1 that adjusts a gain in a low-frequency band. The capacitor C1 and the variable resistance VR1 define a section that controls the low-frequency band. In other words, the capacitor C1 and the variable resistance VR1 define a section that functions as a bass control section. The capacitor C2 and the variable resistance VR2 through which an output signal from the operation amplifier OP is fed back define a section that controls a high-frequency band. The capacitor C2 and the variable resistance VR2 define a section that functions as a treble control section.

In the above-described conventional sound field expanding apparatus, the tone control circuits 45a and 45b require capacitors having a large capacitance. In particular, the capacitor C1 in the bass control section requires a substantially large capacitance that amounts to several $\mu$F. As a consequence, it is difficult to implement such a sound field expanding apparatus in an LSI because it is difficult to internally mount these capacitors in an LSI, and therefore external devices have to be attached to an LSI.

SUMMARY OF THE INVENTION

It is an object of the present invention to provide a sound field expanding apparatus that incorporates a bass control function within an amplitude/phase characteristic changing circuit. It is another object of the present invention to provide a sound field expanding apparatus having a tone control circuit that is formed from capacitors of relatively small capacitance. As a result, implementation of sound field expanding apparatuses in LSIs is facilitated.

In accordance with an embodiment of the present invention, a sound field processor has an amplitude/phase converter device for each of left and right channels. The amplitude/phase converter device includes an amplitude/phase characteristic changing device that receives an input signal having a frequency f and adds specified amplitude $x(f)$/phase $\theta(f)$ characteristics to the input signal based on the frequency f of the input signal. Bass control is performed by interposing a feedback level adjusting device in a feedback path which feeds back an output from the amplitude/phase characteristic changing device of the amplitude/phase converter device.

The amplitude/phase characteristic changing device has a particular low-pass frequency characteristic, and the gain in a low-frequency band of an output from the amplitude/phase characteristic changing device is adjusted by adjusting the level of a feedback signal fed back from the amplitude/phase characteristic changing device according to the particular low-pass frequency characteristic of the amplitude/phase characteristic changing device.

A sound field expanding apparatus in accordance with an embodiment of the present invention includes a first amplitude/phase conversion device having a first inversion amplifier. One of two input signals of left and right channels is input in the first inversion amplifier. A first amplitude/phase characteristic changing device adds a specified amplitude and phase characteristic to an output signal from the first inversion amplifier according to a frequency of the output signal. A first feedback device adds an output from the first amplitude/phase characteristic changing device and an output from the first inversion amplifier to the one of the two input signals and feeds back the same to the first inversion amplifier. The sound field expanding apparatus also includes a second amplitude/phase conversion device having a second inversion amplifier. The other of the two input signals on left and right channels is input in the second inversion amplifier. A second amplitude/phase characteristic changing device adds a specified amplitude and phase characteristic to an output signal from the second inversion amplifier according to a frequency of the output signal. A second feedback device adds an output from the second amplitude/phase characteristic changing device and an output from the second inversion amplifier to the other one of the two input signals and feeds back the same to the second inversion amplifier. A first adder device adds an output from the first inversion amplifier and an output from the second amplitude/phase characteristic changing device, and a second adder device adds an output from the second inversion amplifier and an output from the first amplitude/phase characteristic changing device. A first feedback level adjusting device is interposed in a feedback path of the first feedback device for adjusting a level of a feedback signal of the output from the first amplitude/phase characteristic changing device. A second feedback level adjusting device is interposed in a feedback path of the second feedback device and adjusts a level of a feedback signal of the output from the second amplitude/phase characteristic changing device. The first feedback level adjusting device and the second feedback level adjusting device implemented in a manner described above perform a low-frequency band tone control.

In accordance with an embodiment of the present invention, the first feedback level adjusting device is formed from a first D/A converter that receives an output from the first amplitude/phase characteristic changing device as a high-potential reference input and outputs an analog feedback signal having a signal level adjusted based on bass control data provided from a bass control data source. The second feedback level adjusting device is formed from a second D/A converter that receives an output from the second amplitude/phase characteristic changing device as a high-potential reference input and outputs an analog feedback signal having a signal level adjusted based on bass control data. The sound field expanding apparatus further includes a tone control device that performs a high-frequency band tone control over the outputs from the first and second adder devices.

In accordance with an embodiment of the present invention, the sound field expanding apparatus further includes an adder level adjusting device provided for each of the outputs from the first and second amplitude/phase characteristic changing device. The adder level adjusting device adjusts a sound field expansion amount for each of the outputs from the first and second amplitude/phase characteristic changing devices in response to wide control data provided from a wide control data source. A conversion table is further provided to convert the bass control data to an optimum value according to correlation between the bass control data and the wide control data and supplies the optimum value to the first and second D/A converters.

The adder level adjusting device adjusts an output from the amplitude/phase characteristic changing device by using wide control data which defines a sound field expanding amount. Since an optimum value for bass control data varies depending upon a given value of wide control data, the conversion table is provided to convert bass control data to an optimum value according to correlation between the bass control data and the given wide control data, and the optimized value is supplied to the D/A converter. In this manner, the bass control is optimized.

In a preferred embodiment, the feedback level adjusting device for performing bass control is formed from a D/A converter that receives an output from the amplitude/phase characteristic changing device as a high potential reference input and outputs an analog feedback signal having a level that is adjusted based on the bass control data.

Since the bass control is performed by the level adjustment within the amplitude/phase converter device in accordance with the embodiments of the present invention, a bass control circuit is not required in a tone control circuit that is normally provided in an output stage. Accordingly, capacitors having a large capacitance are not required in the tone control circuit. As a result, a sound field expanding apparatus is readily implemented in an LSI, and external capacitors or terminals for such external capacitors are not required. As a consequence, LSIs are further miniaturized and the cost of such LSIs is reduced.

Other features and advantages of the invention will be apparent from the following detailed description, taken in conjunction with the accompanying drawings which illustrate, by way of example, various features of embodiments of the invention.

BRIEF DESCRIPTION OF THE DRAWINGS

A detailed description of embodiments of the invention will be made with reference to the accompanying drawings.

FIG. 2 (*b*) shows a circuit diagram of a D/A converter in accordance with another embodiment of the present invention.

DETAILED DESCRIPTION OF PREFERRED EMBODIMENTS

An embodiment of the present invention will be described below with reference to the accompanying drawings.

Figure 1:
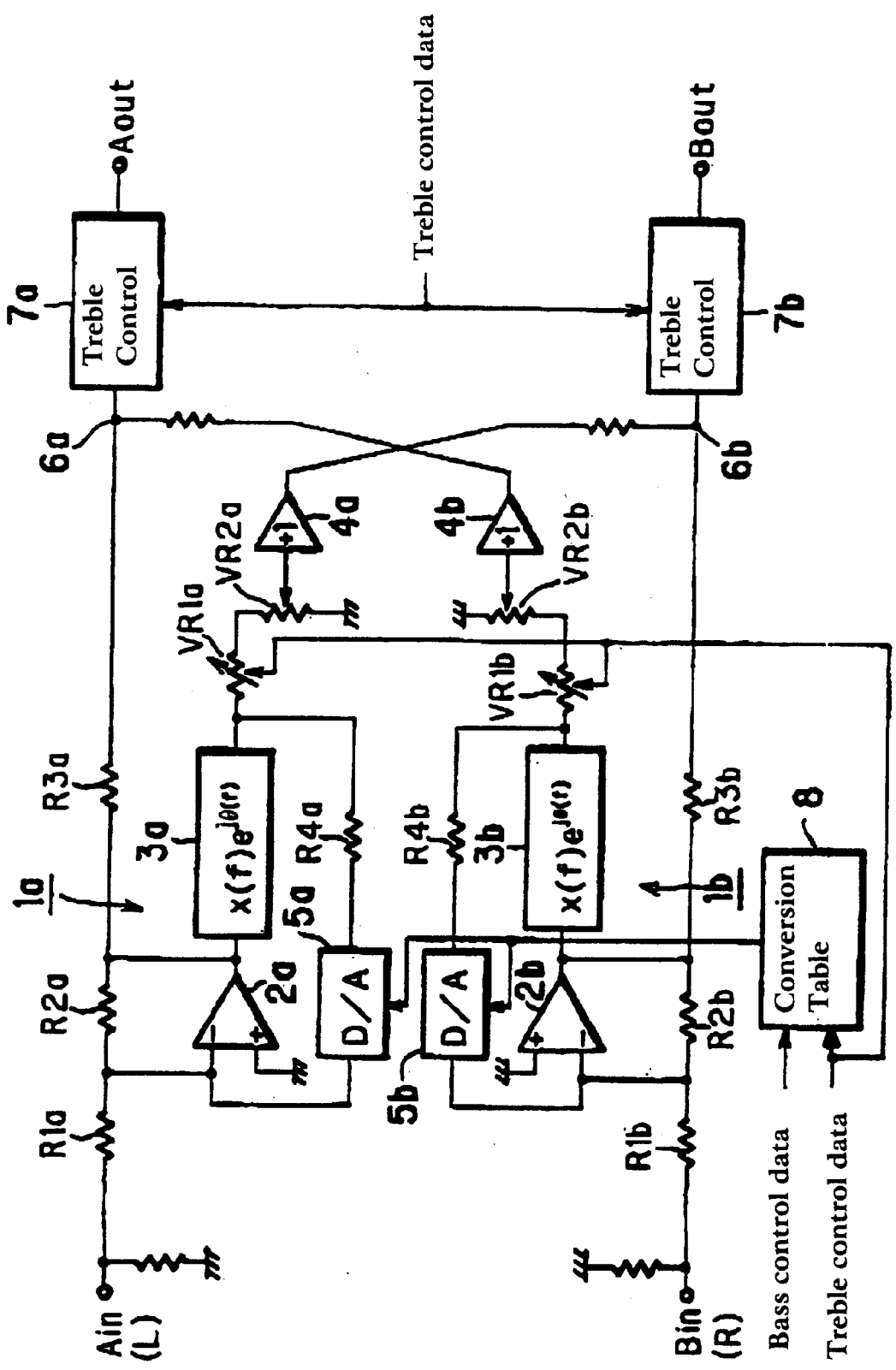
FIG. 1 shows a block diagram of a sound field expanding apparatus in accordance with an embodiment of the present invention.

FIG. 1 shows a structure of a sound field expanding apparatus in accordance with an embodiment of the present invention. First and second amplitude/phase converter circuits 1*a* and 1*b* are provided for left and right stereophonic input signals Ain and Bin of two channels, respectively. The first and the second amplitude/phase converter circuits 1*a* and 1*b* include first and second inversion amplifiers 2*a* and 2*b*, respectively. Left and right signals Ain and Bin are inputted through registers R1*a* and R1*b* to inversion input terminals of the first and second inversion amplifiers 2*a* and 2*b*, respectively. Non-inversion input terminals of the first and second inversion amplifiers 2*a* and 2*b* are grounded, and outputs from the first and second inversion amplifiers 2*a* and 2*b* are fed back to the inversion input terminals of the first and second inversion amplifiers 2*a* and 2*b* through resisters R2*a* and R2*b*, respectively.

First and second amplitude/phase characteristic changing circuits 3*a* and 3*b* are connected to outputs of the inversion amplifiers 2a and 2b to add specified amplitudes x (f) and phases θ (f) to outputs from the respective inversion amplifiers 2a and 2b according to frequencies of the respective outputs. Outputs from the amplitude/phase characteristic changing circuits 3a and 3b are sent to adder level adjusting devices that determine sound field expansion amounts by using wide control data. In an embodiment, the adder level adjusting devices are formed from variable resistances VR1a and VR1b, respectively. Outputs from the variable resistances VR1a and VR1b are then sent through variable resistances VR2a and VR2b, respectively, to buffers 4a and 4b. An output from the variable resistance VR2b is added to an output from the first inversion amplifier 2a by a first adder device 6a, and an output from the variable resistance VR2a is added to an output from the second inversion amplifier 2b by a second adder device 6b. Then, outputs from the first and second adder devices 6a and 6b are sent to tone control circuits 7a and 7b, respectively. In a preferred embodiment, each of the tone control circuits 7a and 7b is formed only by a treble control section, and does not include a bass control section.

Outputs from the first and second amplitude/phase characteristic changing circuits 3a and 3b are also fed back through feedback paths to inversion input terminals of the inversion amplifiers 2a and 2b through resistors R4a and R4b, respectively. First and second D/A converters 5a and 5b are interposed in the feedback paths between the outputs of the first and second amplitude/phase characteristic changing circuits 3a and 3b and the inversion input terminals of the inversion amplifiers 2a and 2b, respectively. The first and second D/A converters 5a and 5b function as first and second feedback level adjusting devices which adjust levels of feedback signals to thereby perform bass control. The D/A converters 5a and 5b receive outputs from the first and second amplitude/phase characteristic changing circuits 3a and 3b, respectively, as high-potential side reference inputs, and output analog feedback signals having levels adjusted by bass control data.

In the present embodiment, signals outputted from the amplitude/phase characteristic changing circuits 3a and 3b (which are to be added to signals on the respective opposite channels) have only low-frequency bands having inverted polarities. As a result, when the signals from the amplitude/phase characteristic changing circuits 3a and 3b are added to signals on the opposite channels by the second and first adder devices 6b and 6a, respectively, the resultant outputs from the first and second adder devices 6a and 6b have attenuated low-frequency bands. To correct the low-frequency bands to have optimum values, a positive feedback is added to inputs to the inversion amplifiers 2a and 2b to amplify the low-frequency bands of the inputs. In accordance with the present embodiment, the more the positive feedback, the greater the amplification of the low-frequency band. However, the attenuation of the low-frequency bands becomes greater as the wide amount is increased. Therefore, it is appreciated that there is an optimum positive feedback (i.e., optimum bass control data) to correct the attenuation of the low-frequency bands for a given value of wide control data that is representative of a predetermined wide amount. In a preferred embodiment, a conversion table memory 8 (that stores a conversion table, for example, shown below in Table 1) is provided to obtain an optimum value for bass control data according to correlation between the bass control data and a given value of wide control data that controls the variable resistances VR1a and VR1b.

Figure 4:
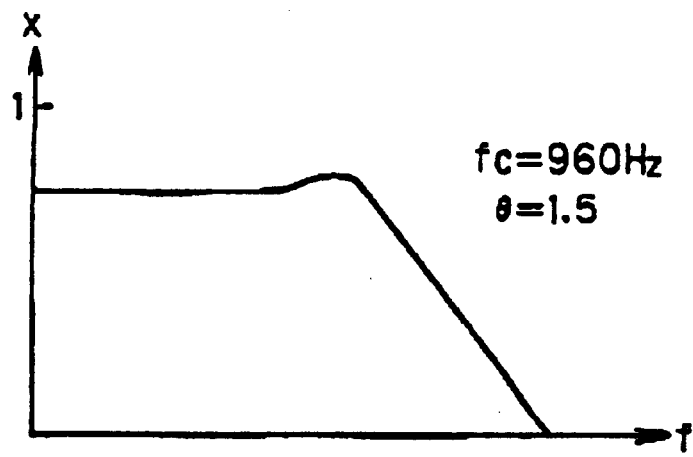
FIG. 4 shows a frequency-amplitude characteristic curve of an amplitude/phase characteristic changing circuit in accordance with an embodiment of the present invention.
Figure 5:
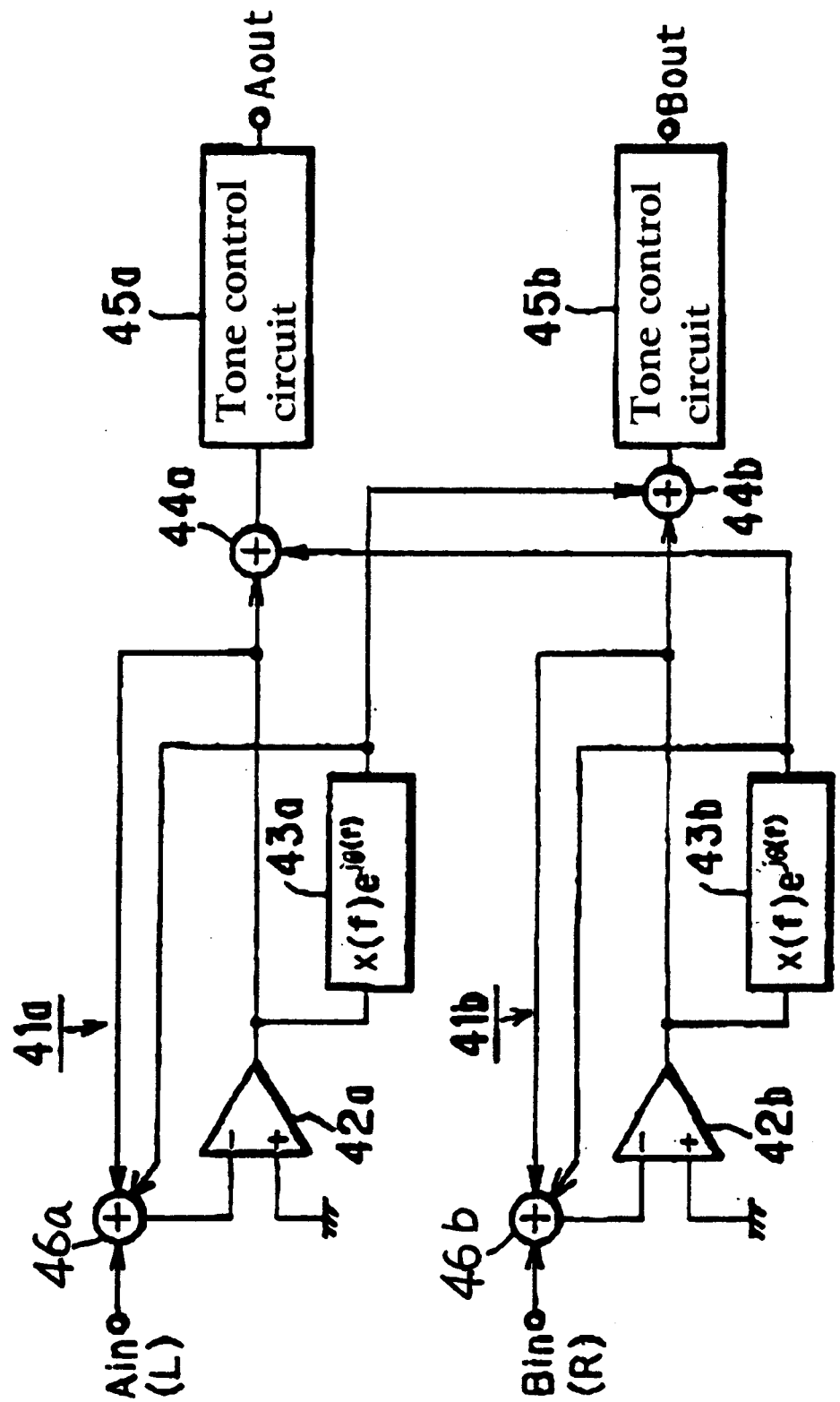
FIG. 5 shows a block diagram of a conventional sound field expanding apparatus.
Figure 6:
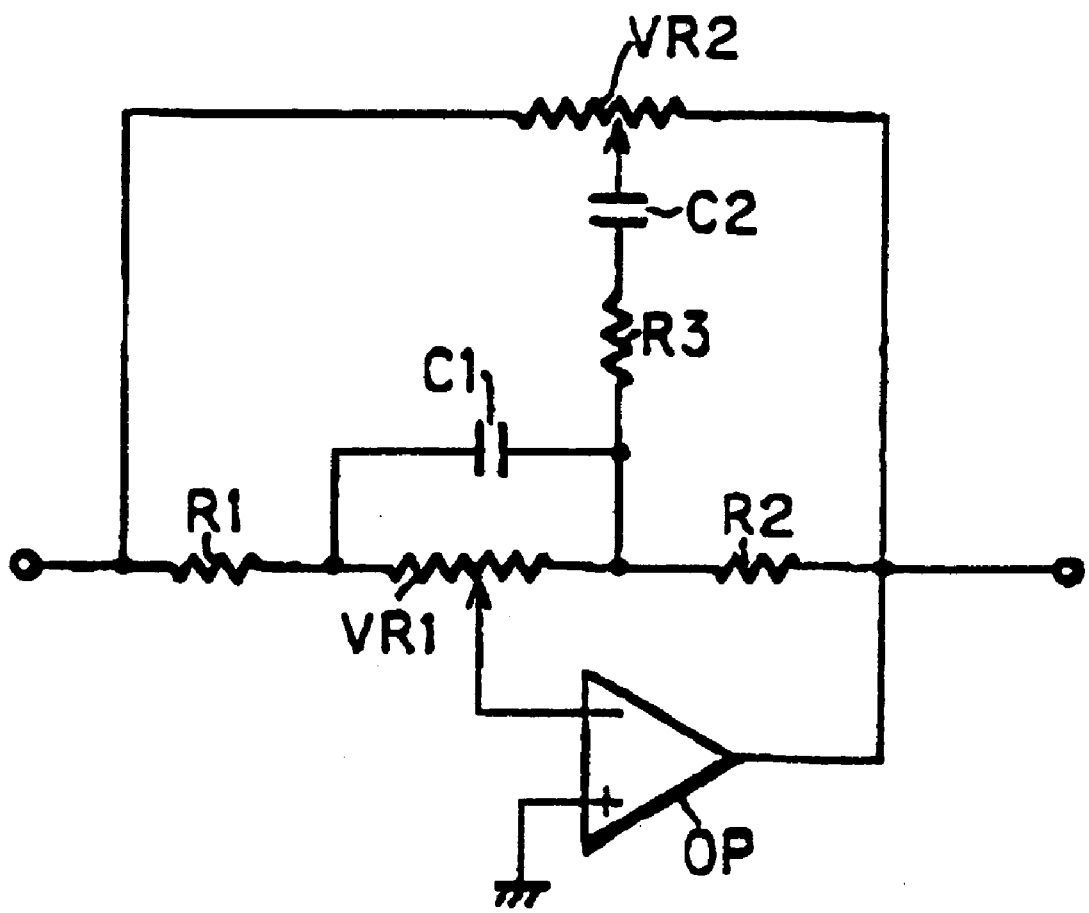
FIG. 6 shows a circuit diagram of a conventional tone control circuit.

The basic operation of the sound field expanding apparatus in accordance with the present embodiment is the same as that of the conventional apparatus shown in FIG. 5. Each of the amplitude/phase characteristic changing circuits 3a and 3b has a frequency characteristic as shown, for example, in FIG. 4. The cut-off frequency of the characteristic is 960 Hz. Therefore, to perform low-frequency band adjustment (bass control), levels of output signals from the amplitude/phase characteristic changing circuits 3a and 3b are adjusted by the D/A converters 5a and 5b based on the frequency characteristic of the amplitude/phase characteristic changing circuits 3a and 3b and fed back to the first and second inversion amplifiers 2a and 2b, respectively.

Figure 2A:
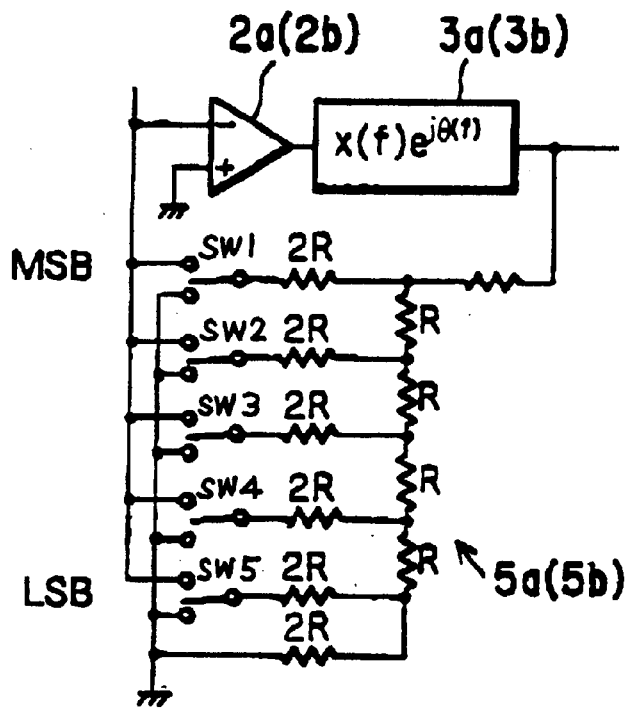
FIG. 2 (*a*) shows a circuit diagram of a D/A converter in accordance with an embodiment of the present invention.

In accordance with an embodiment of the present invention, each of the D/A converters 5a and 5b is formed from a combination of "R–2R" ladder circuits and switches sw1, sw2, sw3, sw4 and sw5 shown in FIG. 2a.

The conversion table memory 8 contains a conversion table that is used to generate optimized bass control data to control the D/A converters 5a and 5b based on bass control data and given wide control data. In a preferred embodiment, the conversion table memory 8 contains a conversion table, shown below in TABLE1, that generates optimized bass control data (each consisting of five-bit data) based on eight steps of wide amount (each consisting of three-bit data) and eight steps of bass amount (each consisting of three-bit data).

TABLE 1

| | | Wide (%) | | | | | | |
|---|---|---|---|---|---|---|---|---|
| | | 0 | 14 | 29 | 43 | 67 | 71 | 86 | 100 |
| | a → | 000 | 001 | 010 | 011 | 100 | 101 | 110 | 111 |
| 10.5 (111) | | 11000 | 11001 | 11010 | 11011 | 11100 | 11101 | 11110 | 11111 |
| 9.0 (110) | | 10110 | 10111 | 11000 | 11001 | 11010 | 11011 | 11101 | 11110 |
| 7.5 (101) | | 10100 | 10101 | 10110 | 10111 | 11001 | 11010 | 11011 | 11101 |
| 6.0 (100) | | 10001 | 10010 | 10011 | 10101 | 10110 | 11001 | 11010 | 11100 |
| 4.5 (011) | | 01110 | 01111 | 10000 | 10010 | 10100 | 10110 | 11001 | 11011 |
| 3.0 (010) | | 01010 | 01011 | 01101 | 01111 | 10010 | 10101 | 10111 | 11010 |
| 1.5 (001) | | 00100 | 00111 | 01001 | 01100 | 10000 | 10011 | 10110 | 11001 |
| 0 (000) | | 00000 | 00010 | 00111 | 01010 | 01110 | 10001 | 10101 | 11000 |
| ↑ b | | | | | | | | | | a . . . Wide control data
b . . . Bass control data

Figure 2:
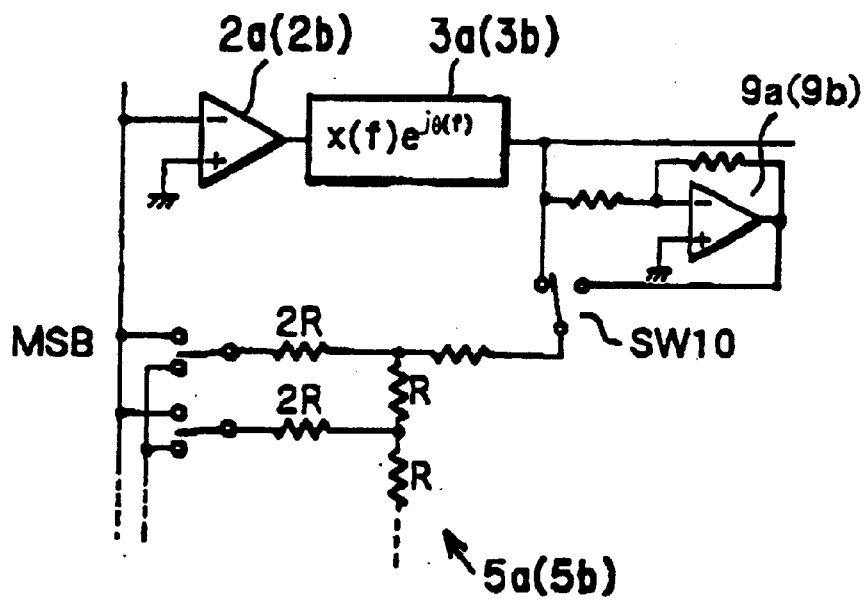

In an embodiment, when the "Wide" amount is 71% and the "Bass" amount is 0 dB, data "10001" is given to each of the D/A converters 5a and 5b. In other words, in a preferred embodiment, the switches sw1 and sw5 at MSB (most significant bit) and at LSB (least significant bit) shown in FIG. 2a are switched to the upper sides, and the remaining switches sw2, sw3 and sw4 are switched to the lower sides. When the "Wide" amount is 71% and the "Bass" amount is 1.5 dB, data "10011" is given to each of the D/A converters 5a and 5b based on TABLE 1 above. In other words, the switches sw1 and sw5 at MSB and at LSB as well as the second switch sw4 from LSB are switched to the upper sides, and the remaining switches sw2 and sw3 are switched to the lower sides. As a result, the amount of feedback to each of the first and second inversion amplifiers 2a and 2b is increased, and therefore the amplitude of the low-frequency band is increased. To decrease the amplitude of the low-frequency band when the "Wide" amount is 71%, smaller data, for example, "01111"(not shown) may be given to each of the D/A converters 5a and 5b. When the low-frequency band is desired to be attenuated to a level lower than a level of attenuation given when the feedback is zero (0), phase inversion circuits 9a and 9b shown in FIG. 2(b) are interposed in the feedback paths of the amplitude/phase characteristic changing devices 3a and 3b, respectively. In the embodiment shown in FIG. 2 (b), the phase inversion circuits 9a and 9b are turned on and off by switches SW10. In this case, one-bit data is added for switching the switches SW10.

Accordingly, for each of the D/A converters 5a and 5b in accordance with the present embodiment, a converter having thirty-two (32) steps is used to obtain optimized bass control feedback levels according to levels of wide amount.

Figure 3:
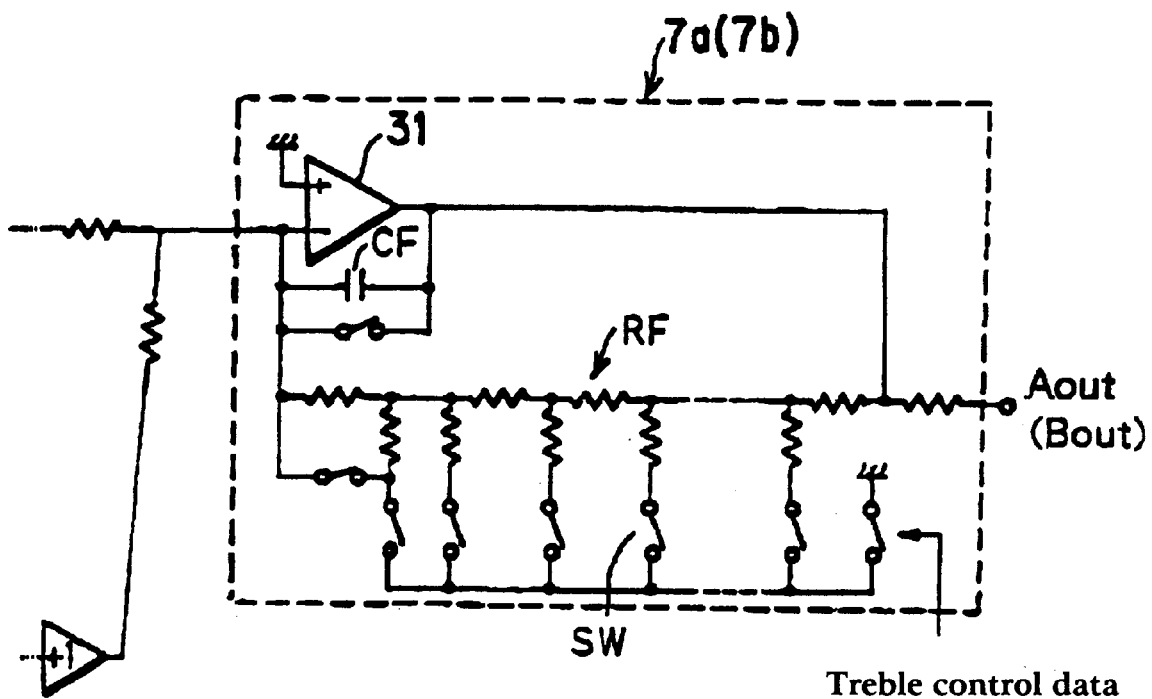
FIG. 3 shows a circuit diagram of a tone control circuit in accordance with an embodiment of the present invention.

In accordance with the present embodiment, the bass control is performed within the amplitude/phase conversion circuits 1a and 1b. Therefore, in a preferred embodiment, each of the tone control circuits 7a and 7b is preferably formed only from a treble control circuit shown in FIG. 3 that performs a high-frequency level adjustment. As shown in FIG. 3, each of the tone control circuits 7a and 7b is formed from an inversion amplifier 31 in which two inputs are added at an inversion input terminal side of the inversion amplifier 31, a feedback capacitor CF, a ladder circuit formed from feedback resistors RF, and a group of switches SW that are controlled by treble control data.

The capacitor CF used for each of the tone control circuits 7a and 7b passes only high-frequency components. Accordingly, a capacitor having a capacitance on the order of pF can be used for the capacitor CF. Such a capacitor is readily implemented in an LSI.

As described above, the bass control is performed within an amplitude/phase converter circuit without using capacitors, and a tone control circuit can be formed from only a treble control circuit. Accordingly, capacitors having large capacitance are not required, and therefore a sound field expanding apparatus is readily implemented in an LSI. Moreover, external-mount type capacitors are not required, and thus terminals for connecting the external-mount type capacitors are also not required. As a result, the size of an LSI can be substantially reduced and the cost for manufacturing an LSI is reduced.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A sound field processor apparatus comprising:
    a first amplitude/phase conversion device having a first inversion amplifier that receives one of two input signals of left and right channels;
    a first amplitude/phase characteristic changing device that adds specified amplitude characteristic and phase characteristic to an output from the first inversion amplifier according to a frequency of the output from the first inversion amplifier;
    a first feedback device that adds an output from the first amplitude/phase characteristic changing device and an output from the first inversion amplifier to the one of the two input signals to generate a first sum signal and feeds back the first sum signal to the first inversion amplifier;
    a second amplitude/phase conversion device having a second inversion amplifier that receives the other of the two input signals of left and right channels;
    a second amplitude/phase characteristic changing device that adds specified amplitude characteristic and phase characteristic to an output from the second inversion amplifier according to a frequency of the output from the second inversion amplifier;
    a second feedback device that adds an output from the second amplitude/phase characteristic changing device and an output from the second inversion amplifier to the other of the two input signals to form a second sum signal and feeds back the second sum signal to the second inversion amplifier;
    a first adder device that adds an output from the first inversion amplifier and an output from the second amplitude/phase characteristic changing device;
    a second adder device that adds an output from the second inversion amplifier and an output from the first amplitude/phase characteristic changing device;
    a first feedback level adjusting device for low-frequency band tone control that is interposed in a feedback path of the first feedback device and adjusts a level of a feedback signal of the output from the first amplitude/phase characteristic changing device; and
    a second feedback level adjusting device for low-frequency band tone control that is interposed in a feedback path of the second feedback device and adjusts a level of a feedback signal of the output from the second amplitude/phase characteristic changing device.

2. A sound field expanding apparatus according to claim 1, further comprising:
    a control data source for supplying at least bass control data,
    wherein the first feedback level adjusting device includes a first D/A converter that receives an output from the first amplitude/phase characteristic changing device as a high potential reference input and outputs an analog feedback signal having a signal level adjusted based on the bass control data, and
    wherein the second feedback level adjusting device includes a second D/A converter that receives an output from the second amplitude/phase characteristic changing device as a high potential reference input and outputs an analog feedback signal having a signal level adjusted based on the bass control data; and a tone control device that performs a high-frequency band tone control over the outputs from the first and second adder devices.

3. A sound field expanding apparatus according to claim 2, further comprising:

a wide control data supply source for supplying wide control data for determining a sound field expansion amount;

an adder level adjusting device provided for each of the outputs from the first and second amplitude/phase characteristic changing devices, wherein the adder level adjusting device is responsive to the wide control data for determining a sound field expansion amount for each of the outputs; and a conversion table that converts the bass control data to an optimum value according to a correlation between the bass control data and the wide control data and supplies the optimum value to the first and second D/A converters.

4. A sound field expanding apparatus comprising:

a first amplitude/phase converter device that processes one of left and right stereophonic signals of two channels, the first amplitude/phase converter device including a first inversion amplifier, a first amplitude/phase characteristic changing device that receives a first input and adds a specified amplitude and phase characteristic to the first input, and a first feedback level adjusting device for performing bass control interposed in a feedback path which feeds back an output from the first amplitude/phase characteristic changing device to the first inversion amplifier;

a second amplitude/phase converter device that processes the other of left and right stereophonic signals of two channels, the second amplitude/phase converter device including a second inversion amplifier, a second amplitude/phase characteristic changing device that receives a second input and adds a specified amplitude and phase characteristic to the second input, and a second feedback level adjusting device for performing bass control interposed in a feedback path which feeds back an output from the second amplitude/phase characteristic changing device to the second inversion amplifier;

a control data source for supplying at least bass control data; and a tone control device that performs a high-frequency band tone control over outputs from the first and second amplitude/phase converter devices, wherein the first feedback level adjusting device includes a first D/A converter that receives an output from the first amplitude/phase characteristic changing device as a high potential reference input and outputs an analog feedback signal having a level adjusted based on the bass control data, and wherein the second feedback level adjusting device includes a second D/A converter that receives an output from the second amplitude/phase characteristic changing device as a high potential reference input and outputs an analog feedback signal having a level adjusted based on the bass control data.

5. A sound field expanding apparatus according to claim 4 further comprising:

a wide control data supply source for supplying wide control data for determining a sound field expansion amount;

an adder level adjusting device provided for each of outputs from the first and second amplitude/phase characteristic changing devices, wherein the adder level adjusting device is responsive to the wide control data for determining a sound field expansion amount for each of the outputs; and a conversion table that converts the bass control data to an optimum value according to a correlation between the bass control data and the wide control data and supplies the optimum value to the first and second D/A converters.

* * * * *